(12) United States Patent
Nakamura et al.

(10) Patent No.: US 6,432,615 B1
(45) Date of Patent: Aug. 13, 2002

(54) ACID-GENERATING COMPOSITION AND RECORDING MATERIAL USING THE SAME

(75) Inventors: Koki Nakamura; Kensuke Morita; Shun-ichi Ishikawa, all of Minami Ashigara (JP)

(73) Assignee: Fuji Photo Film Co., Ltd., Kanagawa (JP)

( * ) Notice: Subject to any disclaimer, the term of this patent is extended or adjusted under 35 U.S.C. 154(b) by 0 days.

(21) Appl. No.: 09/541,082

(22) Filed: Mar. 31, 2000

(30) Foreign Application Priority Data

Mar. 31, 1999 (JP) ............................ 11-093430
Mar. 31, 1999 (JP) ............................ 11-093434

(51) Int. Cl.$^7$ ................................ G03C 5/00
(52) U.S. Cl. ........................ 430/281.1; 430/270.1
(58) Field of Search ......................... 430/281.1, 270.1

(56) References Cited

U.S. PATENT DOCUMENTS 5,395,736 A    3/1995   Grasshoff et al. ........ 430/270.1
6,100,009 A  * 8/2000   Obayashi et al. ........ 430/270.1
6,316,161 B1 * 11/2001  Obayashi et al. ........ 430/280.1

FOREIGN PATENT DOCUMENTS

JP    01-115915   *  5/1989
JP    A934106        2/1997

* cited by examiner

Primary Examiner—Martin Angebranndt
(74) Attorney, Agent, or Firm—Birch, Stewart, Kolasch & Birch, LLP

(57) ABSTRACT

Disclosed is an acid-generating composition comprising at least one polymerizable monomer having a nucleophilic group and at least one acid-generating polymerizable monomer. Also disclosed are a color-forming composition comprising the acid-generating composition and a substance capable of forming a color in the presence of an acid; a photosensitive color-forming composition comprising the color-forming composition and a photopolymerization initiator; and a recording material comprising a support having thereon the color-forming composition or the photosensitive color-forming composition.

12 Claims, No Drawings

ACID-GENERATING COMPOSITION AND RECORDING MATERIAL USING THE SAME

FIELD OF THE INVENTION

The present invention relates to an amplificatory acid generation technique, more specifically, the present invention relates to an acid-generating composition capable of amplifying a small amount of radical to a large amount of acid. Furthermore, the present invention relates to a novel recording material capable of obtaining an image by a simple and easy dry process.

BACKGROUND OF THE INVENTION

A large number of chemical reactions using an acid as a catalyst are known and these are important in industry. In particular, in the field of photoresist, techniques of generating an acid by light and performing precision patterning using the acid generated as a catalyst are known. These are called a chemical amplification-type resist and described in *Photopolymer Gijutsu no Shin-Tenkai* (*New Development of Photopolymer Technology*), Toray Research Center (1993) and the like. According to this technique, a sensitizer capable of generating an acid by light is used and an acid is generated by exposure. The acid generated thermally diffuses and causes crosslinking of polymers or decomposes the polymer side chain to vary the solubility in the developer and thereby a pattern is formed.

The acid-generating method used here has a limit in attaining higher sensitivity because at most one acid can be generated per one photon.

Also, a color image formation method using color formation by an acid is described in U.S. Pat. No. 5,441,850. In this method, an acid precursor is used, which generates an acid under heating using a superstrong acid onium salt and an acid as catalysts. The superstrong acid onium salt is photolyzed by imagewise exposure to generate an superstrong acid, and the superstrong acid which functions as the catalyst makes the acid precursor produce a large amount of acid under heating. In the final stage, an acid-sensitive color-forming dye precursor is allowed to form a color, whereby a color image is obtained.

However, this method has a problem in that for bringing out the action of a slight amount of superstrong acid generated upon exposure, a medium low in the acid receptivity must be used, but in the photosensitive material designed as such, the superstrong acid generated as a noise is readily amplified and the S/N ratio of the finally obtained image is impaired.

In order to solve this problem, if it is designed to prevent a small amount of noise from being amplified, the sensitivity is in turn reduced and this causes a new problem.

For amplifying a small amount of acid into a large amount of acid, another method is known. As described in *Journal of American Chemical Society*, vol. 120, page 37 (1998), a compound which decomposes by a very small amount of acid and generates an acid is known. In this compound, the newly generated acid autocatalytically generates an acid, therefore, a large amplification ratio is expected. However, in the practical viewpoint, this compound has a problem similar to the above-described photosensitive material. More specifically, in the practical use, this acid amplification system can first exert its function when it is used in combination with a certain medium (e.g., binder or developer), but the slight amount of acid to be amplified is neutralized by the medium and a sufficiently large amplification cannot be obtained.

As a still another amplification method, a combination of cationic polymerization with an acid propagating agent has been proposed. JP-A-9-34106 (the term "JP-A" as used herein means an "unexamined published Japanese patent application") describes a combination of a cationic addition polymerizable compound, a cationic polymerization initiator capable of generating a Brønsted acid or Lewis acid which activates the cationic polymerization under irradiation of a chemically acting radiant ray, and a substance (acid propagating agent) capable of generating a new acid by the acid. However, this combination system used in the method where the cationic polymerization is allowed to proceed using a slight amount of acid generated upon exposure, is also readily affected by a medium such as binder or moisture in air, therefore, stable sensitivity cannot be obtained.

Furthermore, the acid-generating method referred to above has a problem in that a satisfactory method has not yet been established for generating an acid by exposure using a visible light.

With respect to the method of preparing a recording material by a simple dry processing using an acid and a substance capable of forming a color in the presence of an acid, a very large number of techniques including pressure-sensitive sheet and heat-sensitive sheet are known.

Also, techniques of preparing a photosensitive material using the same combination are known. Among these, JP-A-57-179835, JP-A-57-197538 and U.S. Pat. No. 4,842,976 describe a method for obtaining a photosensitive material having a high sensitivity by a polymerization reaction, where a microcapsule containing a photopolymerization initiator, a monomer and an acid-sensitive color-forming leuco dye is used and the microcapsules are imagewise cured by imagewise exposure and then applied with a pressure, as a result, the contents are released from uncured microcapsules and contact an acidic substance to thereby form a color. Also, JP-A-61-275472 and JP-A-61-278849 describe a method for obtaining higher sensitivity, where a microcapsule containing a silver halide, a reducing agent, a monomer and an acid-sensitive color-forming leuco dye is used and the microcapsule is imagewise cured and then applied with a pressure, as a result, the contents are released from uncured microcapsules and contact an acid substance and thereby a color is formed. According to these methods, a color image may also be obtained by a simple dry process.

Furthermore, JP-A-3-72358 describes a method where an emulsified product containing a photopolymerization initiator, an acidic moiety-containing monomer, and a heat-responding microcapsule containing an acid-sensitive color-forming leuco dye is used and by applying a heat treatment after imagewise exposure, uncured acidic moiety-containing monomers are brought into contact with a leuco dye in the heat-responding microcapsule to thereby form a color.

These methods all are a technique for positive materials which form a color in the unexposed area. However, in the case of performing- exposure by scanning a laser or the like and forming an image abounded in the white ground area, such as document, negative materials of forming a color in the exposed area are suitably used.

U.S. Pat. No. 5,395,736 describes an acid generation method where a superacid precursor is exposed to generate a superacid and the superacid is brought into contact with a secondary acid generator (e.g., oxalic acid diester) and heated together. By combining this method with, for example, an acid-sensitive color-forming leuco dye, a negative photosensitive material can be obtained. However, it is unknown how higher sensitivity can be obtained in this method (acid propagation) as compared with the method of elevating the sensitivity utilizing amplification by the polymerization.

SUMMARY OF THE INVENTION

One object of the present invention is to provide a technique capable of generating a large amount of acid from a small amount of stimulation (information), which is free of being affected by a medium and is excellent in storage stability.

It is more advantageous in increasing the general-purpose property of the technique to enable amplificatory acid generation by a visible light.

Another object of the present invention is to provide a novel color-forming composition using a novel acid-generating method.

Still another object of the present invention is to provide a recording material using the composition, particularly a negative photosensitive material having a high sensitivity.

These objects can be attained by the following means:

(1) An acid-generating composition comprising at least one polymerizable monomer having a nucleophilic group and at least one acid-generating polymerizable monomer.

(2) An acid-generating composition, which generates an acid by light, comprising at least one polymerizable monomer having a nucleophilic group and at least one acid-generating polymerizable monomer, and further containing a photopolymerization initiator.

(3) A color-forming composition comprising at least one polymerizable monomer having a nucleophilic group, at least one acid-generating, polymerizable monomer, and a substance capable of forming a color in the presence of an acid.

(4) A photosensitive color-forming composition comprising at least one polymerizable monomer having a nucleophilic group, at least one acid-generating polymerizable monomer, a substance capable of forming a color in the presence of an acid, and a photopolymerization initiator.

(5) A recording material comprising a support having thereon at least one polymerizable monomer having a nucleophilic group, at least one acid-generating polymerizable monomer, and a substance capable of forming a color in the presence of an acid.

(6) A photosensitive material comprising a support having thereon at least one polymerizable monomer having a nucleophilic group, at least one acid-generating polymerizable monomer, a substance capable of forming a color in the presence of an acid, and a photopolymerization initiator. (7) A photosensitive material comprising a support having thereon at least one polymerizable monomer having a nucleophilic group, at least one acid-generating polymerizable monomer, a photopolymerization initiator, and a compound represented by formula (6):

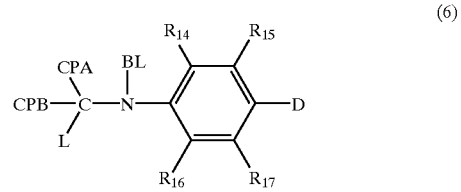

wherein D represents a hydroxyl group or $-NR_{18}R_{19}$, $R_{18}$ and $R_{19}$ each represents a hydrogen atom or a substituent and examples of the substituent include a linear or branched, chained or cyclic alkyl group having from 1 to 50 carbon atoms, a linear or branched, chained or cyclic alkenyl group having from 2 to 50 carbon atoms, an alkynyl group having from 2 to 50 carbon atoms in total, an aryl group having from 6 to 50 carbon atoms, a carbamoyl group having from 1 to 50 carbon atoms, a sulfamoyl group having from 0 to 50 carbon atoms, an aryloxycarbonyl group having from 7 to 50 carbon atoms, an alkoxycarbonyl group having from 2 to 50 carbon atoms, an alkylsulfonyl group having from 1 to 50 carbon atoms, an arylsulfonyl group having from 6 to 50 carbon atoms, a heterocyclic group having from 2 to 50 carbon atoms (a 3-, 4-, 5-, 6-, 7-, 8-, 9-, 10-, 11- or 12-membered monocyclic or condensed ring containing as the hetero atom at least one of, for example, nitrogen, oxygen and sulfur) and an acyl group having from 1 to 50 carbon atoms.

In the present invention, a monomer having a nucleophilic group and an acid-generating monomer are copolymerized, as a result, the nucleophilic group derived from the monomer having a nucleophilic group reacts with the electrophilic center derived from the acid-generating monomer, whereby an acid is generated. More specifically, even if two kinds of monomers are substantially incapable of causing a reaction between respective molecules, when they are copolymerized, a reaction swiftly takes place therebetween because it is an intermolecular reaction, and an acid is generated. This method is advantageous because the amount of acid generated can be decided by the polymerization degree of two kinds of monomers and the effect of a medium is extremely small. By virtue of these advantages, this method can overcome the problem in the acid-generating systems using an acid catalyst, namely, the problem that the acid cannot be generated at a sufficiently high rate due to the effect of a medium.

It is known that in the radical polymerization, the polymerization is generally inhibited by oxygen in air and the sensitivity decreases, and JP-A-9-34106 cited above states that the radical polymerization has an essential limit. However, in the present invention, the effect of a medium is extremely small and the oxygen permeability can be controlled by a binder or the like, therefore, the above-described problem can also be solved.

Furthermore, the acid-generating system of the present invention is based on a radical copolymerization reaction, so that known photoradical polymerization initiating systems comprising a cationic dye and a borate can be utilized and generation of acid in a high concentration by a visible ray, which has been heretofore not satisfactorily attained, can be very easily achieved.

DETAILED DESCRIPTION OF THE INVENTION

The acid-generating composition of the present invention comprises at least two monomers, namely, a monomer having a nucleophilic group and an acid-generating monomer, and along with the copolymerization therebetween, an acid is generated according to the degree of polymerization. These two monomers are described in detail below.

The monomer having a nucleophilic group is preferably represented by the following formula (1):

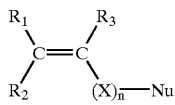

(1)

wherein X represents a divalent linking group, Nu represents a group having a nucleophilic site, n represents 0 or 1, $R_1$, $R_2$ and $R_3$ each represents a hydrogen atom or a substituent, and $R_1$ and $R_2$, $R_1$ and $R_3$, $R_2$ and —$(X)_n$—Nu, or $R_3$ and —$(X)_n$—Nu may be combined with each other to form a ring.

X represents a divalent linking group connecting the polymerizable unsaturated group and Nu. Specific examples of X, which are preferably used, include a substituted or unsubstituted alkylene group, a substituted or unsubstituted arylene group, —O—, —S—, —COO—, —CON(R)—, —SO$_2$—, —SO—, —SO$_2$N(R)—, —OCON(R)—, —N(R)—, —N(R)CON(R')—, —CO— and a combination thereof. Among these, more preferred are a substituted or unsubstituted alkylene group, a substituted or unsubstituted arylene group, —O—, —S—, —COO—, —CON(R)—, —CO— and a combination thereof, and most preferred are a substituted or unsubstituted alkylene group, a substituted or unsubstituted arylene group, —COO—, —CON(R), —CO— and a combination thereof. In these examples, R and R' each represents a hydrogen atom, an alkyl group (the sum of carbon atoms contained in R and R' preferably being from 1 to 24, more preferably 1 to 12), an aryl group (the sum of carbon atoms contained in R and R' preferably being from 6 to 24, more preferably 6 to 18), a heterocyclic group (the sum of carbon atoms contained in R and R' preferably being from 1 to 24, more preferably 1 to 18) or a bond. Examples of the substituent of the substituted alkylene group and substituted arylene group include those represented by $R_7$ to $R_{12}$ which are described later, preferably those having from 0 to 20 carbon atoms. The divalent linking group represented by X preferably has from 0 to 20 carbon atoms, more preferably from 0 to 12 carbon atoms.

Nu represents a group having a nucleophilic site and the nucleophilic site has at least one lone pair of hetero atom. This lone pair is required not to neutralize the acid generated, therefore, the conjugated acid has a pKa of 7 or less. Preferred examples of the nucleophilic site include —CR(R')—OH, —COOH, —CONHR, —SH, —SOH, —SO$_2$H, —CON(R)OH, —N(OH)COR, —SO$_2$NHR and —N(OH)SO$_2$R. Among these, more preferred are —CR(R')—OH, —COOH, —CONHR, —CON(R)OH and —N(OH)COR, and most preferred are —CR(R')—OH, —CON(R)OH and —N(OH)COR. The number of these nucleophilic sites which Nu may have is from 2 to 10. In the case where two or more nucleophilic sites are present, they may be the same or different. In the examples above, R and R' are the same as defined above with respect to the definition of X.

$R_1$, $R_2$ and $R_3$ each represents a hydrogen atom or a substituent. $R_1$ and $R_2$ each preferably represents a hydrogen atom, a substituted or unsubstituted alkyl group, a substituted or unsubstituted aryl group, —COOR, —CONRR', —SO$_2$R, —SO$_2$NRR', —SR, —SOR, —OR, —NRR' or —$(X)_n$—Nu, more preferably a hydrogen atom, a substituted or unsubstituted alkyl group, —COOR, —CONRR' or —$(X)_n$—Nu, and most preferably a hydrogen atom or a substituted or unsubstituted alkyl group. In these substituents, R and R' are the same as defined above with respect to the definition of X.

$R_3$ preferably represents a a hydrogen atom, a substituted or unsubstituted alkyl group, a substituted or unsubstituted aryl group, —COOR, —CONRR', —SO$_2$R, —SO$_2$NRR', —SR, —SOR, —OR, —NRR' or —$(X)_n$—Nu, more preferably a a hydrogen atom, a substituted or unsubstituted alkyl group, a substituted or unsubstituted aryl group, —COOR or —CONRR', and most preferably a a hydrogen atom, a substituted or unsubstituted alkyl group, —COOR or —CONRR'.

In these substituents, R and R' are the same as defined above with respect to the definition of X. The substituted or unsubstituted alkyl group represented by $R_1$, $R_2$ or $R_3$ preferably has from 1 to 12 carbon atoms, more preferably from 1 to 4 carbon atoms, and the substituted or unsubstituted aryl group represented by $R_1$, $R_2$ or $R_3$ preferably has from 6 to 12 carbon atoms, more preferably from 6 to 8 carbon atoms. Examples of the substituent of the substituted alkyl group or the substituted aryl group include those represented by $R_7$ to $R_{12}$ which are described later.

$R_1$ and $R_2$, $R_1$ and $R_3$, $R_2$ and —$(X)_n$—Nu, or $R_3$ and —$(X)_n$—Nu may be combined with each other to form a ring.

The acid-generating monomer is a monomer which copolymerizes with the monomer having a nucleophilic group and reacts with the nucleophilic group derived from the monomer having a nucleophilic group to generate an acid. This monomer is preferably represented by the following formula (2):

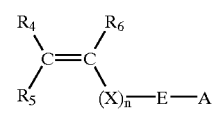

(2)

wherein X represents a divalent linking group, E represents a group having a nucleophilic access target (electrophilic) site; A represents a group capable of generating an acid as a result of the polymerizable monomer having a nucleophilic group being copolymerized with the acid-generating polymerizable monomer represented by formula (2) and the nucleophilic group derived from the polymerizable monomer having a nucleophilic group being reacted with E in formula (2); n represents 0 or 1; and $R_4$, $R_5$ and $R_6$ each represents a hydrogen atom or a substituent, the same as defined as $R_4$, $R_5$ and $R_6$, respectively, and $R_4$ and $R_5$, $R_4$ and $R_6$, $R_5$ and —$(X)_n$—E—A, or $R_6$ and —$(X)_n$—E—A may be combined with each other to form a ring.

X has the same meaning as defined above in formula (I).

E represents a group having a nucleophilic access target (electrophilic) site and preferably represents —CO—, —COO—, —CON(R")—, —O—CO—O—, —SO$_2$— or —SO$_3$—, most preferably —COO— or —CON(R")—.

A represents a group capable of generating an acid as a result of the polymerizable monomer having a nucleophilic group being copolymerized with the acid-generating polymerizable monomer and the nucleophilic group derived from the polymerizable monomer having a nucleophilic group being reacted with E in formula (2). The acid generated is preferably HO—SO$_2$—R, HO—SO$_2$—Ar, HO—SO₂—OR, HO—SO₂—OAr, HCl, HBr, HI, HO—COR, HO—COAr, HSO₂—R or HSO₂—Ar, more preferably HO—SO₂—R, HO—SO₂—Ar, HO—SO₂—OR, HO—SO₂—OAr, HO—COR or HO—COAr, and most preferably HO—SO₂—R or HO—SO₂—Ar. In these acids, R and R" have the same meanings as R and R' described above and Ar represents an aryl group. The acid generated is an acid having a pKa of from −10 to 10, preferably from −10 to 5, more preferably from −8 to 4, and most preferably −5 to 3.

Examples of the group which can be used as the mechanism of copolymerizing monomers represented by formulae (1) and (2) and then reacting Nu and E to generate an acid from A, include a group using a cleavage reaction of hemiacetal described in U.S. Pat. Nos. 4,146,396, 4,652,516 and 4,698,297; a group capable of causing a cleavage reaction using an intramolecular nucleophilic substitution reaction described in U.S. Pat. Nos. 4,248,962, 4,847,185, 4,912,028 and 4,857,440; a group capable of causing a cleavage reaction using an electron transfer reaction described in U.S. Pat. Nos. 4,409,323, 5,034,311, 5,055,385 and 4,421,845; a group capable of causing a cleavage reaction using a hydrolysis of iminoketal described in U.S. Pat. No. 4,546,073; and a group capable of causing a cleavage reaction using a hydrolysis reaction of ester described in British Patent Publication No. 1,531,927. Among the acid-generating monomers represented by formula (2), the acid-generating monomers which can be most effectively used in the present invention are represented by the following formulae (3), (4) and (5):

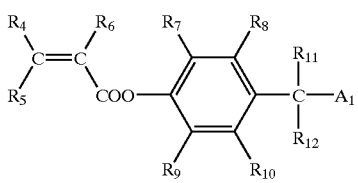

(3)

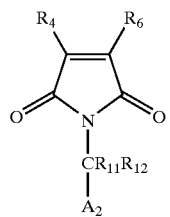

(4)

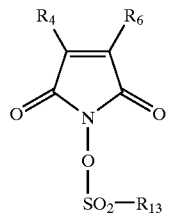

(5)

In formulae (3), (4) and (5), $R_4$, $R_5$ and $R_6$ have the same meanings as defined in formula (2), and $R_7$, $R_8$, $R_9$, $R_{10}$, $R_{11}$ and $R_{12}$ each represents a hydrogen atom or a substituent.

$R_7$, $R_8$, $R_9$, $R_{10}$, $R_{11}$ and $R_{12}$ each preferably represents a linear or branched, chained or cyclic alkyl group having from 1 to 50 carbon atoms, a linear or branched, chained or cyclic alkenyl group having from 2 to 50 carbon atoms, an alkynyl group having from 2 to 50 carbon atoms, an aryl group having from 6 to 50 carbon atoms, an acyloxy group having from 1 to 50 carbon atoms, a carbamoyloxy group having from 1 to 50 carbon atoms, a carbonamide group having from 1 to 50 carbon atoms, a sulfonamide group having from 1 to 50 carbon atoms, a carbamoyl group having from 1 to 50 carbon atoms, a sulfamoyl group having from 0 to 50 carbon atoms, an alkoxy group having from 1 to 50 carbon atoms, an aryloxy group having from 6 to 50 carbon atoms, an aryloxycarbonyl group having from 7 to 50 carbon atoms, an alkoxycarbonyl group having from 2 to 50 carbon atoms, an N-acylsulfamoyl group having from 1 to 50 carbon atoms, an alkylsulfonyl group having from 1 to 50 carbon atoms, an arylsulfonyl group having from 6 to 50 carbon atoms, an alkoxycarbonylamino group having from 2 to 50 carbon atoms, an aryloxycarbonylamino group having from 7 to 50 carbon atoms, an amino group having from 0 to 50 carbon atoms, a cyano group, a nitro group, a carboxyl group, a hydroxy group, a sulfo group, a mercapto group, an alkylsulfinyl group having from 1 to 50 carbon atoms, an arylsulfinyl group having from 6 to 50 carbon atoms, an alkylthio group having from 1 to 50 carbon atoms, an arylthio group having from 6 to 50 carbon atoms, a ureido group having from 1 to 50 carbon atoms, a heterocyclic group having from 2 to 50 carbon atoms (a 3-, 4-, 5-, 6-, 7-, 8-, 9-, 10-, 11- or 12-membered monocyclic or condensed ring containing as the hetero atom at least one of, for example, nitrogen, oxygen and sulfur), an acyl group having from 1 to 50 carbon atoms, a sulfamoylamino group having from 0 to 50 carbon atoms, a silyl group having from 3 to 50 carbon atoms, or a halogen atom (e.g., fluorine atom, chlorine atom, bromine atom, iodine atom). These substituents each may further have a substituent and examples of the substituent include the substituents described above. If possible, $R_7$ and $R_8$, $R_9$ and $R_{10}$, or $R_{11}$ and $R_{12}$ may be combined to form a ring.

$A_1$ and $A_2$ each represents an acid residue of those described above as examples of the acid generated from A after the release.

$R_{13}$ represents an alkyl group, an aryl group, a heterocyclic group, an alkoxy group or an aryloxy group, preferably an alkyl group, an aryl group or a heterocyclic group, and most preferably an alkyl group or an aryl group.

Specific examples of the monomers represented by formulae (1) and (2) for use in the present invention are set forth below, however, the scope of the present invention is by no means limited to these specific examples.

Specific Examples of Polymerizable Monomer having Nucleophilic Group

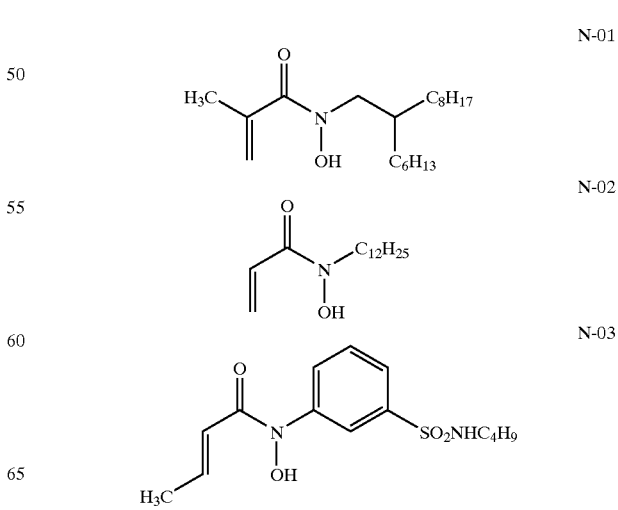

-continued
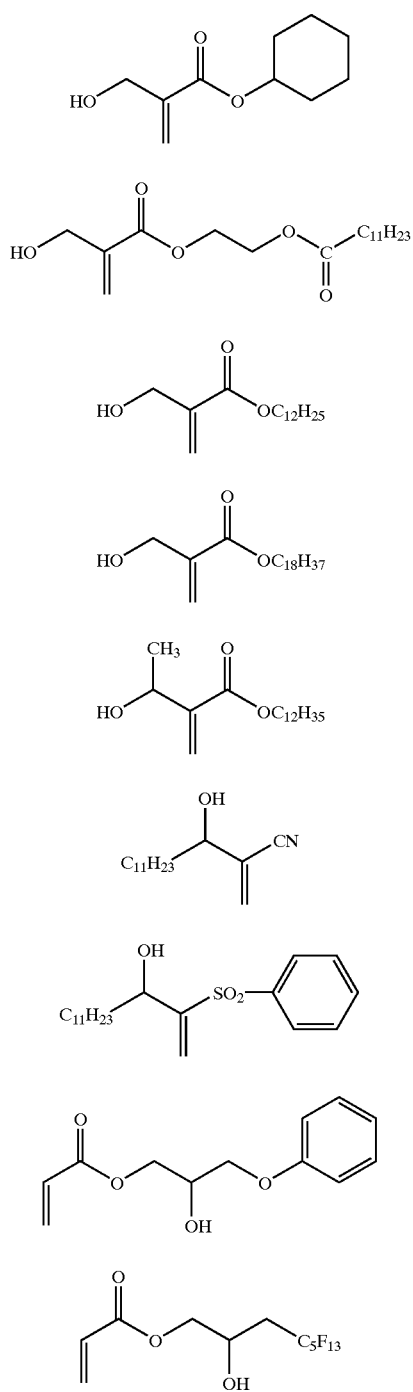
Specific Examples of Acid-Generating Polymerizable Monomer
-continued
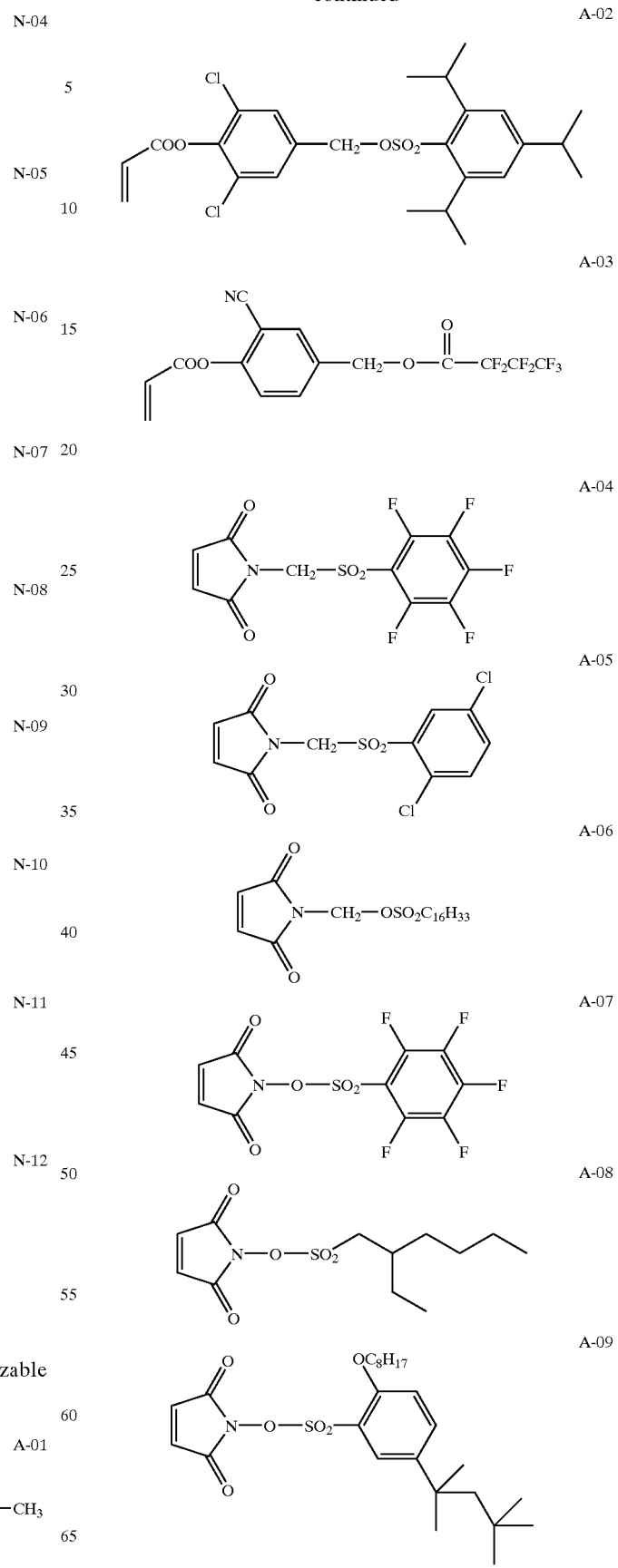

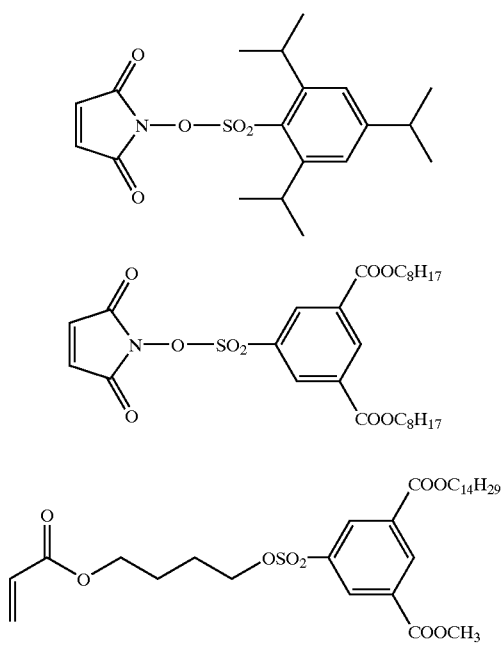

The synthesis methods of the polymerizable monomer having a nucleophilic group and the acid-generating polymerizable monomer are described below.

The monomer having a nucleophilic group can be generally synthesized by the following two representative synthesis methods. One is a method of reacting an amine having a nucleophilic group or an alcohol having a nucleophilic group and with an acid halide of a carboxylic acid having a polymerizable group, and another is a method known as a Baylis-Hillman reaction where an acrylic acid ester or an acrylic acid amide and an aldehyde are reacted in the presence of 1,4-diazabicyclo[2.2.2]octane (hereinafter simply referred to as "DABCO"). The Baylis-Hillman reaction is described in detail in *Tetrahedron*, Vol. 52, No. 24, pp. 8001–8062.

These two synthesis methods are specifically described below.

Synthesis Example 1 (Synthesis of Compound N-01)
(1-1) Synthesis of 2-hexyldecylhydroxylamine 69 g of hydroxylamine hydrochloride, 30.5 g of 2-hexyldecylbromide, 0.5 g of EDTA and 500 ml of methanol were mixed and thereto 84 g of sodium hydrogencarbonate was added. The resulting mixture was heated under reflux for 3 hours. Then, the reaction mixture was concentrated, ethyl acetate and water were added thereto, the solution obtained was extracted by liquid separation, and the organic phase was dried over magnesium sulfate. The dried organic phase was concentrated and bis(2-hexyldecyl) hydroxylamine as a by-product was removed using silica gel column chromatography to produce the objective compound. The product was a colorless liquid. Yield: 10.5 g (40.9%).
(1-2) Synthesis of N-hexyldecyl-N-hydroxymethacrylamide (N-01)

To a mixed solution containing 50 ml of water, 100 ml of ethyl acetate and 10.3 g of 2-hexyldecylhydroxylamine, 20 g of sodium hydrogen carbonate was added. The resulting solution was stirred and cooled by adding 50 g of ice. To this mixture, 5 g of methacrylic acid chloride was added dropwise over 2 minutes and after the completion of dropwise addition, the mixed solution obtained was stirred for 1 hour.

The organic phase obtained by the liquid separation was dried over magnesium sulfate and to the dried organic phase, a slight amount of p-methoxyphenol was added as a polymerization inhibitor. Then, the resulting solution was concentrated under reduced pressure.

The concentrate obtained was subjected to silica gel column chromatography to produce the objective compound. The objective compound was obtained as a colorless liquid. Yield: 6.8 g. Yield: 52.1%.

Synthesis Example 2 (Synthesis of Compound N-06)

To a mixed solution containing 120 g of dodecyl acetate, 50 g of formalin and 200 ml of THF, 20 g of DABCO was added under ice cooling. After 30 minutes, the solution obtained was heated to set the reaction temperature at 40° C. The reaction was continued for 7 days and after adding 500 ml of water and 800 ml of ethyl acetate, the reaction solution was extracted by liquid separation. The organic phase was concentrated and then subjected to silica gel column chromatography to produce the objective compound. The objective compound was obtained as a colorless liquid. Yield: 82.0 g (60.8%).

The synthesis method of the acid-generating polymerizable monomer is specifically described by referring to Synthesis Examples 3 to 5.

Synthesis Example 3 (Synthesis of Compound A-01)
(3-1) Synthesis of 4-formylphenyl methacrylate To 61 g of 4-hydroxybenzaldehyde, 400 ml of acetonitrile and 84 ml of triethylamine were added to effect the dissolution. The resulting solution was cooled to 0° C. by ice-methanol and thereto 48.4 ml of methacrylic acid chloride was gradually added dropwise. After 2 hours, the reaction solution was extracted by liquid separation with water and ethyl acetate and then subjected to silica gel column chromatography to produce the objective compound. The objective compound obtained was immediately used in the following reaction.
(3-2) Synthesis of 4-hydroxymethylphenyl methacrylate To the entire amount of the compound obtained in (3-1), 300 ml of THF and 100 ml of water were added and stirred. To this solution, sodium boron hydride was added little by little under ice cooling. Every each addition, disappearance of starting materials was confirmed by TLC. After the starting materials disappeared, water and ethyl acetate were added to the reaction solution and the reaction solution was extracted by liquid separation. The organic phase was dried over magnesium sulfate, concentrated and then subjected to silica gel column chromatography to produce the objective compound. The objective compound was obtained as a slightly brown oily product. Yield: 40.1 g (41.7%) (through two steps from 4-hydroxybenzaldehyde).
(3-3) Synthesis of 4-(p-toluenesulfonyloxymethyl)phenyl methacrylate (A-01)

37 g of 4-hydroxymethylphenyl methacrylate was dissolved in 250 ml of THF and after adding thereto 32.4 ml of triethylamine, the resulting solution was cooled to 5° C. and stirred. To this solution, 64 g of p-toluenesulfonic anhydride was added in 10 parts. After the completion of addition, the solution was reacted at 5° C. or less for 1 hour and gradually cooled to room temperature. The reaction solution was left standing over night, and water and ethyl acetate were added to effect extraction by liquid separation. The organic phase was dried over magnesium sulfate, concentrated and then subjected to column chromatography to produce the objective compound. The objective compound was obtained as a slightly yellow-tinted oily product. Yield: 17.7 g (26.6%).

Synthesis Example 4 (Synthesis of Compound N-05)

To 12.7 g of N-hydroxymethylmaleimide and 27.1 g of 2,5-dichlorobenzenesulfonyl chloride, 150 ml of acetonitrile was added. The resulting solution was stirred and to this reaction mixture, 15 ml of pyridine and 1 g of 4-dimethylaminopyridine were added. After left standing over night, the reaction solution was extracted by adding water and ethyl acetate and then subjected to short silica gel column chromatography to produce the objective compound. The product was crystallized by adding ethyl acetate, and as a result, the objective compound was obtained as a colorless solid. Yield: 6 g (17.8%).

Synthesis Example 5 (Synthesis of Compound A-10)

(5-1) Synthesis of exo-N-hydroxy-7-oxabicyclo[2.2.1]hepto-5-ene-2,3-dicarboxyimide 139 g of hydroxylamine hydrochloride was dissolved in 650 ml of methanol and to this solution, a solution obtained by dissolving 112 g of potassium hydroxide in 280 ml of methanol was added dropwise under ice cooling. The inorganic salt precipitated was removed by suction filtration using Celite. To the thus-obtained methanol solution of hydroxylamine, 332 g of exo-3,6-epoxy-1,2,3,6-tetrahydrophthalic anhydride was added. Then, heat was generated and crystals precipitated. After stirring for 2 hours, the crystals precipitated were collected by filtration, washed thee times with methanol, and dried. Yield: 302 g, 83.3%.

(5-2) Synthesis of exo-N-(2,4,6-triisopropylbenzenesulfonyloxy)-7-oxabicyclo[2.2.1]hepto-5-ene-2,3-dicarboxyimide 100 g of exo-N-hydroxy-7-oxobicyclo[2.2.1]hepto-5-ene-2,3-dicarboxyimide and 500 ml of acetonitrile were mixed and thereto 170.5 g of 2,4,6-triisopropylbenzenesulfonyl chloride was added. The mixture obtained was stirred and to the resulting reaction mixture, 60 ml of pyridine was added dropwise. The resulting solution was heated to 60° C. and reacted for 2 hours. After cooling, the crystals obtained were collected by filtration and recrystallized in methanol. Yield: 191.7 g (77.6%).

(5-3) Synthesis of N-(2,4,6-triisopropylbenzenesulfonyloxy)maleimide (Compound A-10)

30 g of exo-N-(2,4,6-triisopropylbenzenesulfonyloxy)-7-oxabicyclo[2.2.1]hepto-5-ene-2,3-dicarboxyimide was dispersed in 200 ml of xylene and the dispersion was heated while slowly blowing nitrogen gas thereinto. The reaction was carefully traced by TLC to confirm the disappearance of starting materials. After the reaction time reached about 3 hours, the reaction solution was cooled and then colorless crystals precipitated. The crystals precipitated were collected by filtration and dried. Yield: 15.2 g (59.7%).

The polymerizable monomer having a nucleophilic group and the acid-generating polymerizable monomer of the present invention each may be arbitrarily selected according to the necessity. The mixing ratio of these two monomers may be arbitrarily selected according to the purpose, however, the molar ratio therebetween is preferably from 1:1,000 to 1,000:1, more preferably from 1:100 to 100:1, and most preferably from 1:10 to 10:1.

In the present invention, the above-described two monomers may be polymerized by merely heating them at a high temperature or may be combined with a thermal polymerization initiator. Examples of the (thermal) polymerization initiator used for the vinyl-based monomer include azo-type initiators such as 2,2'-azobisisobutyronitrile, 2,2'-azobis(2,4-dimethylvaleronitrile), dimethyl-2,2'-azobis(2-methylpropionate) and dimethyl-2,2'-azobisisobutyrate, and peroxide-type initiators such as lauryl peroxide, benzoyl peroxide and tert-butyl peroctoate. In the case of azo-type initiator, initiation systems such as radiant ray or electron beam may also be used other than heat. The amount of the initiator added is not particularly limited and one skilled in the art may appropriately select the amount from the ranges suitable for respective polymerization methods. The method for adding the initiator is also not particularly limited, and batchwise addition or addition in parts may be appropriately selected. With respect to the polymerization temperature, an appropriate temperature may be selected depending on the kinds of initiator and monomers.

In the present invention, a photopolymerization initiator may also be used in combination. As the photopolymerization initiator, a large number of known compounds may be used and examples thereof include compounds capable of generating a radical by a Norrish I Type reaction where the bond between a carbonyl group and a carbon atom adjacent thereto is cleaved; compounds capable of directly performing the photolysis, such as oxime esters, peroxides, organic sulfur compounds, halides and phosphine oxides; aromatic ketones capable of generating a ketyl radical by a hydrogen subtraction reaction, such as benzophenone; combinations of allowing a donor and an acceptor to form an exciplex and thereby causing transfer of electron and proton to generate a radical, such as combination of ketone and amine; and photo-redox system capable of generating a radical in a composite system of a dye and a weakly reducing agent. Other than these, the compounds described in Monroe et al., *Chemical Review*, Vol. 93, pp. 435–446 (1993) may also be used.

Some of the above-described photopolymerization initiators have sensitivity in the visible region and these are advantageous in that a visible light source of various types, such as visible laser, LED and white fluorescent lamp, can be used. As the photopolymerization initiator having sensitivity in the visible region, Japanese Patent No. 2726258 discloses a photopolymerization initiator comprising a cationic dye/anionic boron compound complex and this can be particularly suitably used in the present invention.

The color-forming composition of the present invention comprises the above-described two monomers, namely, a monomer having a nucleophilic group and an acid-generating monomer, and further contains a substance capable of forming a color in the presence of an acid. Along with the copolymerization of these monomers, an acid is generated according to the degree of polymerization and a color is formed in correspondence to the acid generated.

The substance capable of reacting with an acid and thereby forming a color for use in the color-forming composition of the present invention is described below. Leuco dyes having a partial structure of lactone, lactam, spiropyran or the like can be used to this purpose.

The acid-sensitive color-forming substance is more preferably the following color-forming agent. This color-forming agent is hereinafter simply referred to as "BLD".

The BLD which can be preferably used in the present invention is represented by the following formula (6):

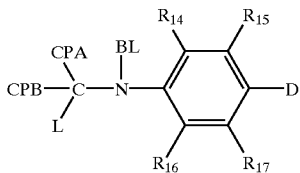

(6)

In formula (6), D represents a hydroxyl group or —$NR_{18}R_{19}$. $R_{18}$ and $R_{19}$ each represents a hydrogen atom or a substituent and examples of the substituent include a linear or branched, chained or cyclic alkyl group having from 1 to 50 carbon atoms, a linear or branched, chained or cyclic alkenyl group having from 2 to 50 carbon atoms, an alkynyl group having from 2 to 50 carbon atoms in total, an aryl group having from 6 to 50 carbon atoms, a carbamoyl group having from 1 to 50 carbon atoms, a sulfamoyl group having from 0 to 50 carbon atoms, an aryloxycarbonyl group having from 7 to 50 carbon atoms, an alkoxycarbonyl group having from 2 to 50 carbon atoms, an alkylsulfonyl group having from 1 to 50 carbon atoms, an arylsulfonyl group having from 6 to 50 carbon atoms, a heterocyclic group having from 2 to 50 carbon atoms (a 3-, 4-, 5-, 6-, 7-, 8-, 9-, 10-, 11- or 12-membered monocyclic or condensed ring containing as the hetero atom at least one of, for example, nitrogen, oxygen and sulfur) and an acyl group having from 1 to 50 carbon atoms. Among these, preferred are a hydrogen atom, a linear or branched, chained or cyclic alkyl group having from 1 to 50 carbon atoms, a linear or branched, chained or cyclic alkenyl group having from 2 to 50 carbon atoms, an alkynyl group having from 2to 50 carbon atoms in total and an aryl group having from 6 to 50 carbon atoms. These substituents each may further have a substituent and examples of the substituent include those described above as examples of $R_7$ to $R_{12}$ in formulae (3) to (5).

$R_{14}$, $R_{15}$, $R_{16}$ and $R_{17}$ each represents a hydrogen atom or a substituent and examples of the substituent include those described above as examples of $R_7$ to $R_{12}$ in formulae (3) to (5). $R_{14}$ and $R_{15}$, $R_{15}$ and $R_{18}$ (or $R_{19}$), $R_{17}$ and $R_{18}$ (or $R_{19}$), or $R_{16}$ and $R_{17}$ may form a ring.

BL represents a block group bonded to the nitrogen atom and the block group represents —$CONR_{20}R_{201}$ or another acid-sensitive removable group. $R_{20}$ and $R_{201}$ each represents a hydrogen atom or a substituent and examples of the substituent include a linear or branched, chained or cyclic alkyl group having from 1 to 50 carbon atoms, a linear or branched, chained or cyclic alkenyl group having from 2 to 50 carbon atoms, an alkynyl group having from 2 to 50 carbon atoms in total, an aryl group having from 6 to 50 carbon atoms, a carbonamide group having from 1 to 50 carbon atoms, a sulfonamide group having from 1 to 50 carbon atoms, a carbamoyl group having from 1 to 50 carbon atoms, a sulfamoyl group having from 0 to 50 carbon atoms, an alkoxy group having from 1 to 50 carbon atoms, an aryloxy group having from 6 to 50 carbon atoms, an aryloxycarbonyl group having from 7 to 50 carbon atoms, an alkoxycarbonyl group having from 2 to 50 carbon atoms, an alkylsulfonyl group having from 1 to 50 carbon atoms, an arylsulfonyl group having from 6 to 50 carbon atoms, an alkoxycarbonylamino group having from 2 to 50 carbon atoms, an amino group having from 0 to 50 carbon atoms, a cyano group, a hydroxy group, a sulfo group, an alkylthio group having from 1 to 50 carbon atoms, an arylthio group having from 6 to 50 carbon atoms, a ureido group having from 1 to 50 carbon atoms, a heterocyclic group having from 2 to 50 carbon atoms (a 3-, 4-, 5-, 6-, 7-, 8-, 9-, 10-, 11- or 12-membered monocyclic or condensed ring containing as the hetero atom at least one of, for example, nitrogen, oxygen and sulfur), an acyl group having from 1 to 50 carbon atoms, a sulfamoylamino group having from 0 to 50 carbon atoms, and a silyl group having from 3 to 50 carbon atoms. These substituents each may further have a substituent and examples of the substituent include those described above as examples of $R_7$ to $R_{12}$ in formulae (3) to (5). Among the above-described substituents, preferred are a hydrogen atom, an alkyl group having from 1 to 30 carbon atoms and an aryl group having from 1 to 30 carbon atoms, and in a more preferred embodiment, either one of $R_{20}$ and $R_{201}$ is a hydrogen atom.

The acid-sensitive removable group means a group which can be removed by an acid generated from the acid-generating polymerizable monomer represented by formula (2). In this respect, the block groups for an amino group are described in detail in Theodora W. Green and Peter G. Wuts, *Protective Group In Organic Synthesis*, 2nd ed., pp. 309–405, John Wiley & Sons, Inc. (1991). Among these block groups, preferred are those which can be removed by an acid, more preferred are tertiary alkoxycarbonyl groups such as a tert-butoxycarbonyl group (BOC group).

L represents a splitting-off group. L and BL split off by the action of an acid and thereby a color-forming compound (dye) is formed.

When BL is an acid-sensitive removable group other than —$CONR_{20}R_{201}$, L is a heterocyclic group (a saturated or unsaturated, 5-, 6- or 7-membered monocyclic or condensed ring containing as the hetero atom at least one of nitrogen, oxygen and sulfur, e.g., succinimide, maleimide, phthalimide, diglycolimide, pyrrole, pyrazole, imidazole, 1,2,4-triazole, tetrazole, indole, benzopyrazole, benzimidazole, benzotriazole, imidazoline-2,4-dione, oxazolidine-2,4-dione, thiazolidine-2,4-dione, oxazolin-2-one, thiazolin-2-one, benzimidazolin-2-one, 2-pyridone), a halogen atom (e g., fluorine, chlorine, bromine, iodine), an aryloxy group (e.g., phenoxy, 4-cyanophenoxy), a heterocyclic oxy group (e.g., pyridyloxy, pyrazolyloxy), an acyloxy group (e.g., acetoxy, benzoyloxy), an alkoxy group (e.g., methoxy, dodecyloxy), a carbamoyloxy group (e.g., N,N-diethylcarbamoyloxy, morpholinocarbonyloxy), an aryloxycarbonyloxy group (e.g., phenoxycarbonyloxy), an alkoxycarbonyloxy group (e.g., methoxycarbonyloxy, ethoxycarbonyloxy), an arylthio group (e.g., phenylthio, naphthylthio), a heterocyclic thio group (e.g., tetrazolylthio, 1,3,4-thiadiazolylthio, 1,3,4-oxadiazolylthio, benzimidazolylthio), an alkylthio group (e.g., methylthio, octylthio, hexadecylthio), an alkylsulfonyloxy group (e.g., methanesulfonyloxy), an arylsulfonyloxy group (e.g., benzenesulfonyloxy, toluenesulfonyloxy), a carbonamide group (e.g., acetamide, trifluoroacetamide), a sulfonamide group (e.g., methanesulfonamide, benzenesulfonamide), an alkylsulfonyl group (e.g., methanesulfonyl), an arylsulfonyl group (e.g., benzenesulfonyl), an alkylsulfinyl group (e.g., methanesulfinyl), an arylsulfinyl group (e.g., benzenesulfinyl), an arylazo group (e.g., phenylazo, naphthylazo) or a carbamoylamino group (e.g., N-methylcarbamoylamino).

When BL is an acid-sensitive removable group other than —$CONR_{20}R_{201}$, L is preferably a heterocyclic group, a halogen atom, an aryloxy group, a heterocyclic oxy group, an acyloxy group, a carbamoyloxy group, an aryloxycarbonyloxy group, an alkoxycarbonyloxy group, an arylthio group, a heterocyclic thio group, an alkylsulfonyloxy group or an arylsulfonyloxy group.

When BL is —$CONR_{20}R_{201}$, L is preferably a basic group capable of being protonated by an acid generated from the acid-generating polymerizable monomer. Particularly preferred examples of the basic group include imidazole, pyrazole, triazole and tetrazole. The basic group may be arbitrarily substituted so as to control the easiness to protonation or the releasability. Examples of the substituent include those described above as examples of $R_7$ to $R_{12}$ in formulae (3) to (5).

CPA and CPB each represents an atomic group necessary for forming a color coupler well known in the silver salt photographic art, together with the carbon atom (C in formula (6)) to which CPA and CPB are bonded. The partial structure (coupler) formed by CPA, CPB and carbon atom C is described below.

This partial structure called a coupler is described in detail in T. H. James (compiler), *Theory of Photographic Process*, 4th ed., pp. 291–334 and pp. 354–361, Macmillan (1977), JP-A-58-12353, JP-A-58-149046, JP-A-58-149047, JP-A-59-11114, JP-A-59-124399, JP-A-59-174835, JP-A-59-231539, JP-A-59-231540, JP-A-60-2951, JP-A-60-14242, JP-A-60-23474 and JP-A-60-66249.

The couplers preferably used in the present invention are the structures represented by the following formulae (7) to (18) and these are couplers generally called active methylene, pyrazolone, pyrazoloazole, phenol, naphthol and pyrrolotriazole, respectively.

In the structures shown below inclusive of L in formula (6), the mark * means a bond for the bonding to N in formula (6).

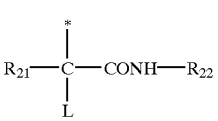

(7)

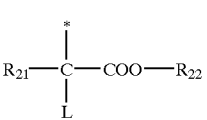

(8)

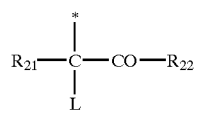

(9)

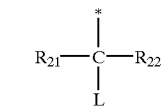

(10)

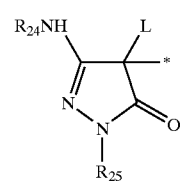

(11)

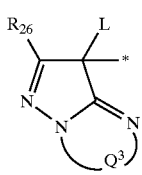

(12)

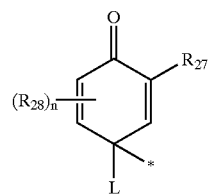

(13)

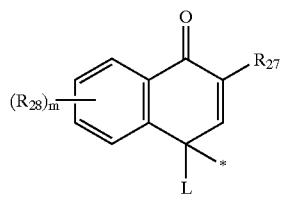

(14)

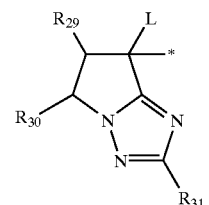

(15)

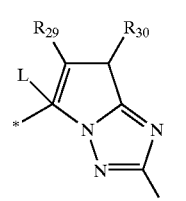

(16)

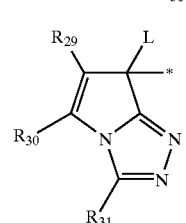

(17)

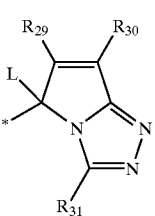

(18)

The couplers represented by formulae (7) to (10) are called an active methylene-based coupler. In formulae (7) to (10), $R_{21}$ represents an acyl group, a cyano group, a nitro group, an aryl group, a heterocyclic residue, an alkoxycarbonyl group, an aryloxycarbonyl group, a carbamoyl group, a sulfamoyl group, an alkylsulfonyl group or an arylsulfonyl group, which may have a substituent.

In formulae (7) to (9), $R_{22}$ represents an alkyl group, an aryl group or a heterocyclic residue, which may have a substituent. In formula (10), $R_{23}$ represents aryl group, an aryl group or a heterocyclic residue, which may have a substituent. Examples of the substituent which $R_{21}$, $R_{22}$ or $R_{23}$ may have include those described above for $R_7$ to $R_{12}$ in formulae (3) to (5). $R_{21}$ and $R_{22}$, or $R_{21}$ and $R_{23}$ may be combined with each other to form a ring.

The coupler represented by formula (11) is called a 5-pyrazolone-type coupler. In formula (11), $R_{24}$ represents an alkyl group, an aryl group, an acyl group or a carbamoyl group and $R_{25}$ represents a phenyl group or a phenyl group substituted by one or more halogen atom, alkyl group, cyano group, alkoxy group, alkoxycarbonyl group or acylamino group.

Among the 5-pyrazolone-based couplers represented by formula (11), those where $R_{24}$ is an aryl group or an acyl group and $R_{25}$ is a phenyl group substituted by one or more halogen atom are preferred.

This preferred embodiment is described below. $R_{24}$ is preferably an aryl group such as phenyl group, 2-chlorophenyl group, 2-methoxyphenyl group, 2-chloro-5-tetradecanamidophenyl group, 2-chloro-5-(3-octadecenyl-1-succinimido)phenyl group, 2-chloro-5-octadecylsulfonamidephenyl group and 2-chloro-5-[2-(4-hydroxy-3-t-butylphenoxy)tetradecanamide]phenyl group, or an acyl group such as acetyl group, 2-(2,4-di-t-pentylphenoxy)butanoyl group, benzoyl group or 3-(2,4-di-t-amylphenoxyacetamido)benzoyl group. These groups each may further have a substituent and examples of the substituent include an organic substituent or a halogen atom bonded through carbon atom, oxygen atom, nitrogen atom or sulfur atom.

$R_{25}$ is preferably a substituted phenyl group such as 2,4,6-trichlorophenyl group, 2,5-dichlorophenyl group and 2-chlorophenyl group.

The coupler represented by formula (12) is called a pyrazoloazole-type coupler. In formula (12), $R_{26}$ represents a hydrogen atom or a substituent, $Q_3$ represents a nonmetallic atom group necessary for forming a 5-membered azole ring containing from 2 to 4 nitrogen atoms. The azole ring may have a substituent (including a condensed ring).

Among the pyrazoloazole-type couplers represented by formula (12), in view of the spectral absorption property of the colored dye, imidazo[1,2-b]pyrazoles described in U.S. Pat. No. 4,500,630, pyrazolo[1,5-b]-1,2,4-triazoles described in U.S. Pat. No. 4,500,654, and pyrazolo[5,1-c]-1,2,4-triazoles described in U.S. Pat. No. 3,725,067 are preferred.

The substituent on the azole ring represented by the substituents $R_{26}$ or $Q_3$ is descried in detail, for example, in U.S. Pat. No. 4,540,654, column 2, line 41 to column 8, line 27. Among these, preferred are pyrazoloazole couplers where a branched alkyl group is directly bonded to the 2-, 3- or 6-position of a pyrazolotriazole group described in JP-A-61-65245, pyrazoloazole couplers containing a sulfonamide group within the molecule described in JP-A-61-65245, pyrazoloazole couplers having an alkoxyphenylsulfonamide ballast group described in JP-A-61-147254, pyrazolotriazole couplers having an alkoxy group or an aryloxy group at the 6-position described in JP-A-62-209457 and JP-A-63-307453, and pyrazolotriazole couplers having a carbonamide group within the molecule described in JP-A-2-201443.

The couplers represented by formulae (13) and (14) are called a phenol-type coupler and a naphthol-type coupler, respectively. In formulae (13) and (14), $R_{27}$ represents a hydrogen atom or a group selected from —$CONR_{32}R_{33}$, —$SO_2NR_{32}R_{33}$, —$NHCOR_{32}$, —$NHCONR_{32}R_{33}$ and —$NHSO_2NR_{32}R_{33}$ (wherein $R_{32}$ and $R_{33}$ each represents a hydrogen atom or a substituent).

$R_{28}$ represents a substituent, λ represents an integer selected from 0 to 2, and m represents an integer selected from 0 to 4. When λ and m each is 2 or more, the substituents $R_{28}$ may be the same or different. Examples of the substituent represented by $R_{28}$, $R_{32}$ or $R_{33}$ include those described above as examples of $R_7$ to $R_{12}$ in formulae (3) to (5).

Preferred examples of the phenol-type coupler represented by formula (13) include 2-acylamino-5-alkylphenol couplers described in U.S. Pat. Nos. 2,369,929, 2,801,171, 2,772,162, 2,895,826 and 3,772,002, 2,5-diacylaminophenol couplers described in U.S. Pat. Nos. 2,772,162, 3,758,308, 4,126,396, 4,334,011 and 4,327,173, West German Patent Publication (DOS) 3,329,729 and JP-A-59-166956, and 2-phenylureido-5-acylaminophenol couplers described in U.S. Pat. Nos. 3,446,622, 4,333,999, 4,451,559 and 4,427,767.

Preferred examples of the naphthol coupler represented by formula (14) include 2-carbamoyl-1-naphthol couplers described in U.S. Pat. Nos. 2,474,293, 4,052,212, 4,146,396, 4,282,233 and 4,296,200, and 2-carbamoyl-5-amido-1-naphthol couplers described in U.S. Pat. No. 4,690,889.

The couplers represented by formulae (15) to (18) are called a pyrrolotriazole coupler. In formulae (15) to (18), $R_{29}$, $R_{30}$ and $R_{31}$ each represents a hydrogen- atom or a substituent. Examples of the substituent represented by $R_{29}$, $R_{30}$ or $R_{31}$ include those described as examples of $R_7$ to $R_{12}$ in formulae (3) to (5). Preferred examples of the pyrrolotriazole coupler include couplers where at least one of $R_{32}$ and $R_{33}$ is an electron withdrawing group described in European Patent Publications 488,248A1, 491,197A1 and 545,300.

In addition, couplers having a structure such as condensed phenol, imidazole, pyrrole, 3-hydroxypyridine, active methylene, active methine, 5,5-condensed heterocyclic ring or 5,6-condensed heterocyclic ring, may be used.

Examples of the condensed phenol-type coupler which can be used include couplers described in U.S. Pat. Nos. 4,327,173, 4,564,586 and 4,904,575.

Examples of the imidazole-type coupler which can be used include couplers described in U.S. Pat. Nos. 4,818,672 and 5,051,347.

Examples of the 3-hydroxypyridine-type coupler which can be used include couplers described in JP-A-1-315736.

Examples of the active methylene or active methine coupler which can be used include couplers described in U.S. Pat. Nos. 5,104,783 and 5,162,196.

Examples of the 5,5-condensed heterocyclic ring-type coupler which can be used include pyrrolopyrazole-based couplers described in U.S. Pat. No. 5,164,289 and pyrroloimidazole-based couplers described in JP-A-4-174429.

Examples of the 5,6-condensed heterocyclic ring-type coupler which can be used include pyrazolopyrimidine-based couplers described in U.S. Pat. No. 4,950,585, pyrrolotriazine-based couplers described in JP-A-4-204730, and couplers described in European Patent 556,700.

Other examples of the coupler which can also be used in the present invention include couplers described in West German Patent Publication Nos. 3,819,051A and 3,823,049, U.S. Pat. Nos. 4,840,883, 5,024,930, 5,051,347 and 4,481,268, European Patent Publication Nos. 304856A2, 329036, 354549A2, 374781A2, 379110A2 and 386930A1, JP-A-63-141055, JP-A-64-32260, JP-A-64-32261, JP-A-2-297547, JP-A-2-44340, JP-A-2-110555, JP-A-3-7938, JP-A-3-160440, JP-A-3-172839, JP-A-4-172447, JP-A-4-179949, JP-A-4-182645, JP-A-4-184437, JP-A-4-188138, JP-A-4-188139, JP-A-4-194847, JP-A-4-204532, JP-A-4-204731 and JP-A-4-204732.

Specific examples of BLD which can be preferably used in the present invention are set forth below.

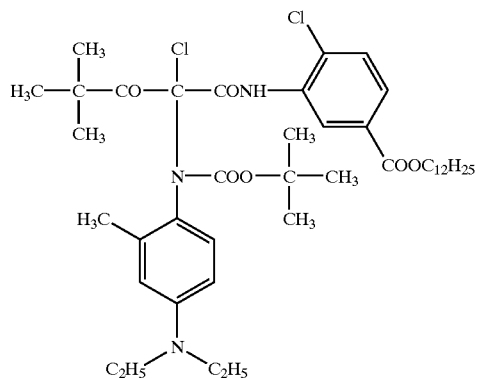
BLD-01
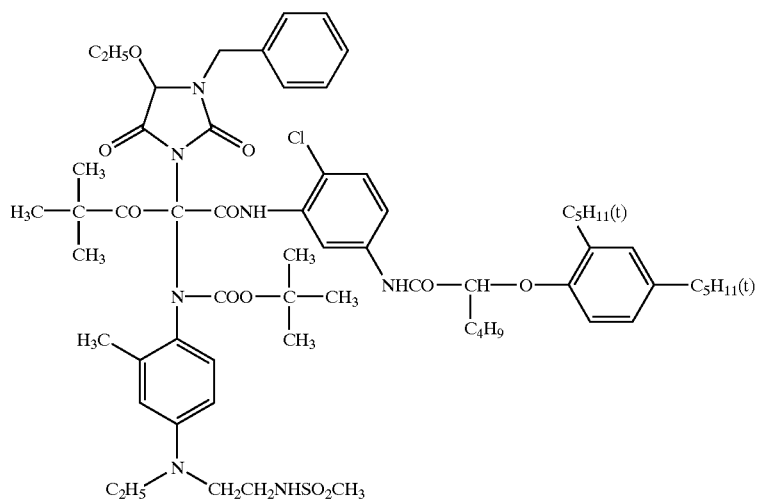
BLD-02
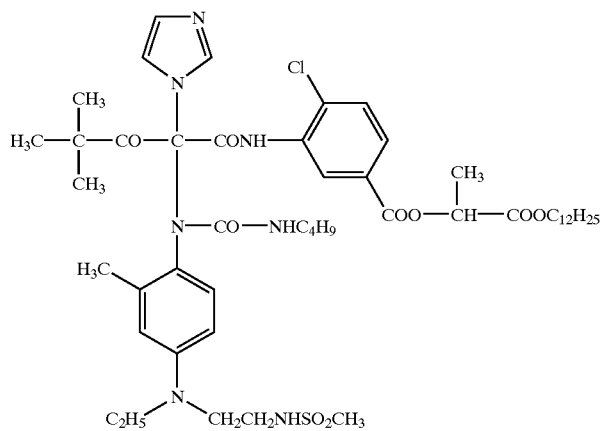
BLD-03

-continued
BLD-04
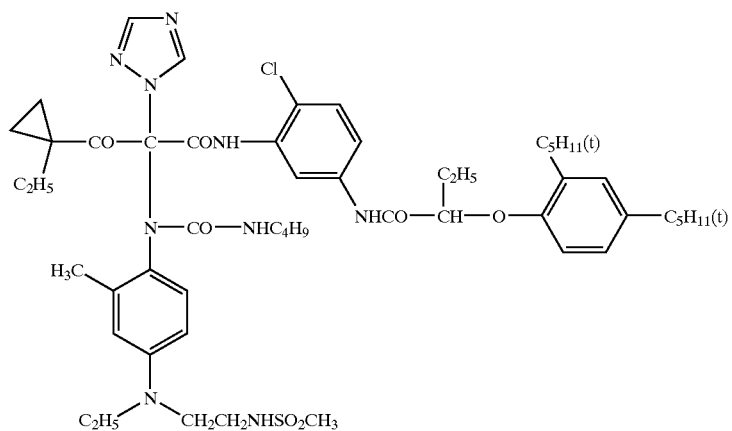
BLD-05
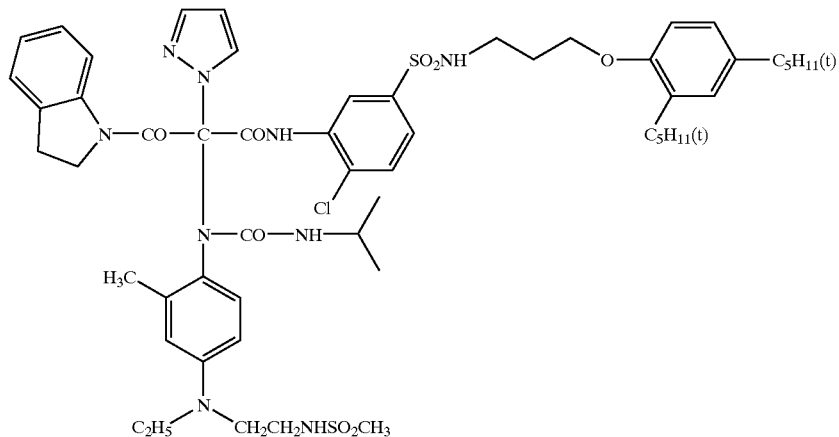
BLD-06
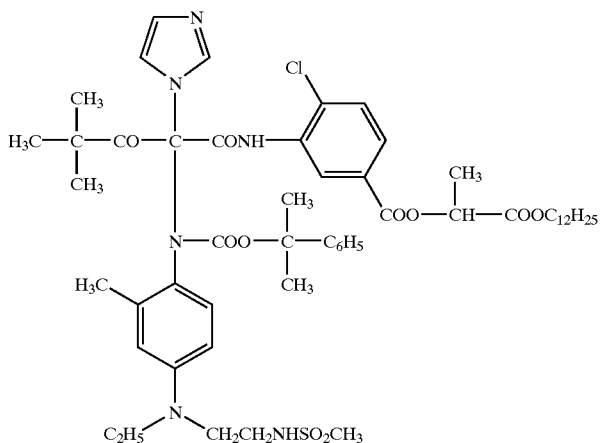

BLD-07
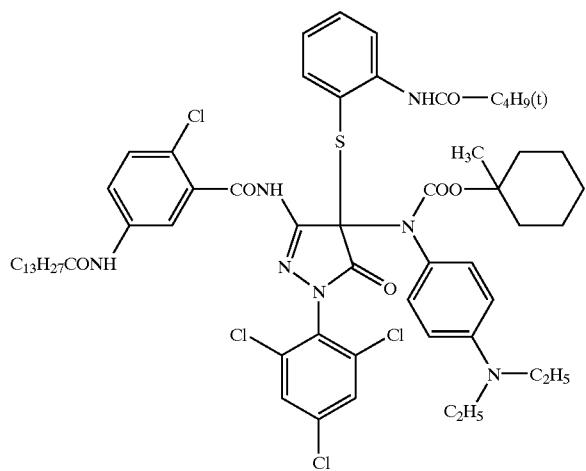
BLD-08
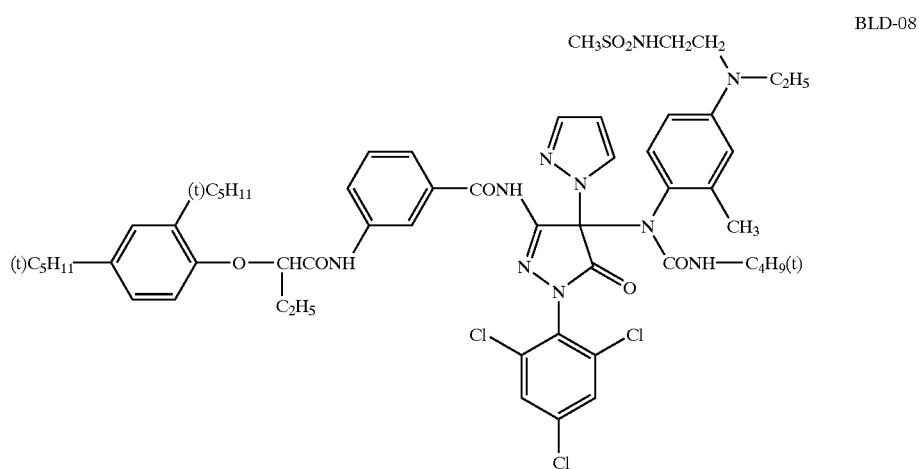
BLD-09
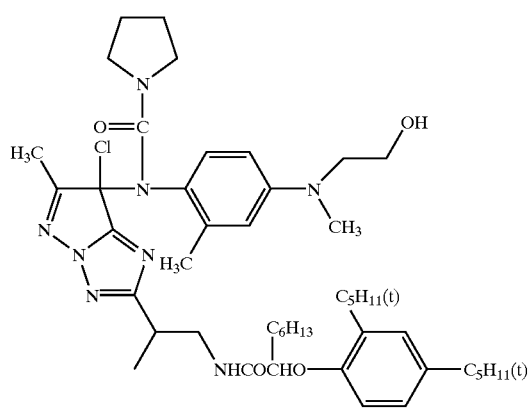

BLD-10
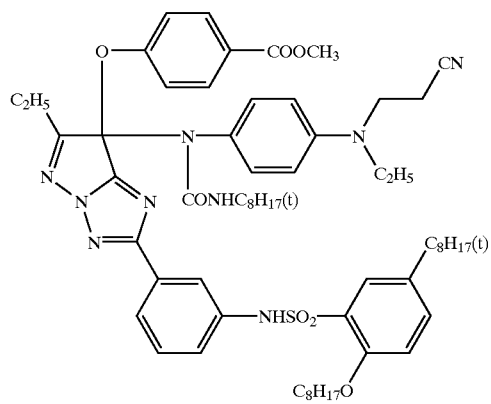
BLD-11
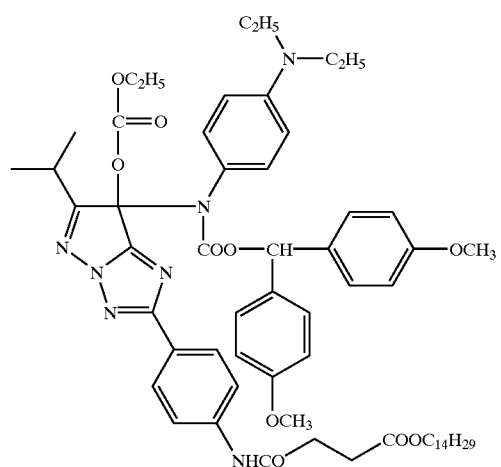
BLD-12
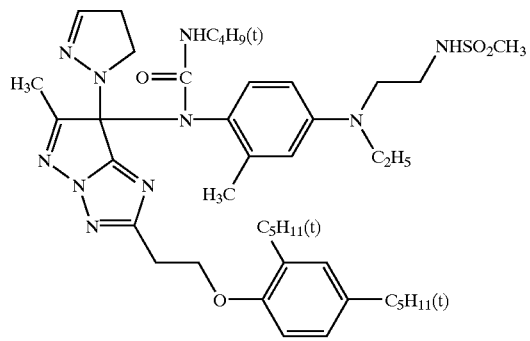

BLD-13
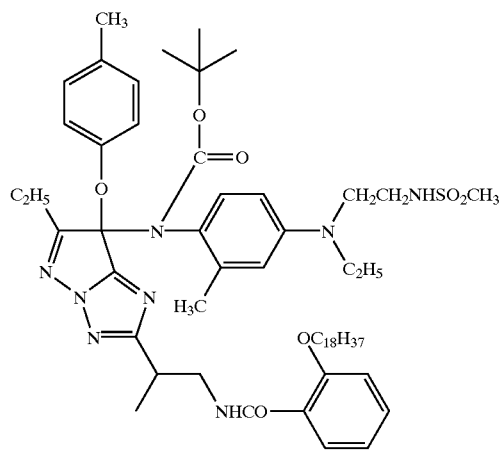
BLD-14
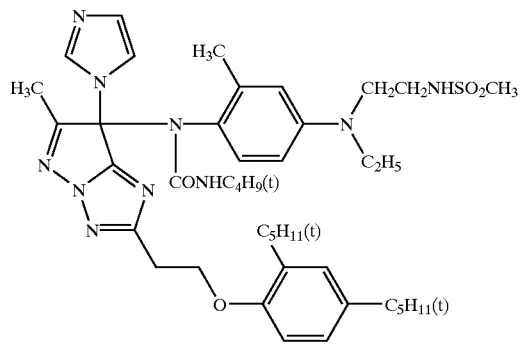
BLD-15
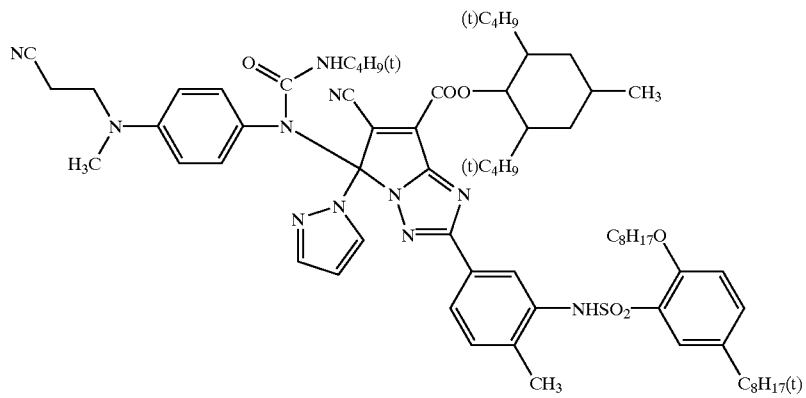
BLD-16
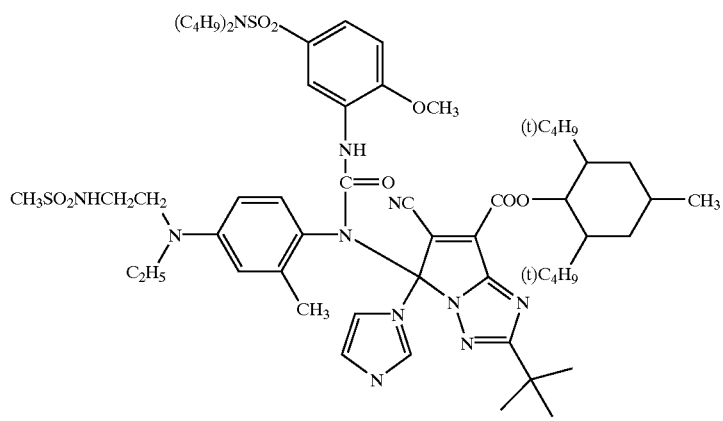

BLD-17

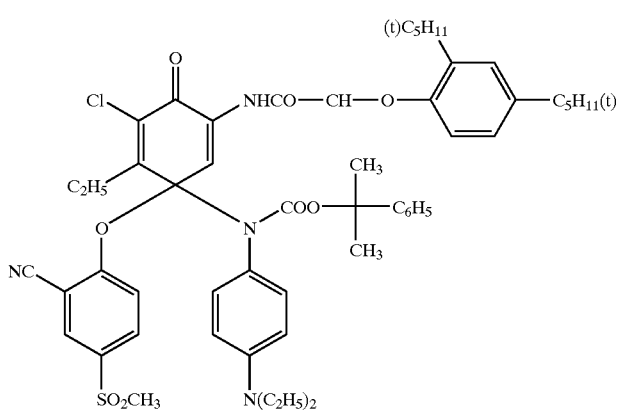

BLD-18

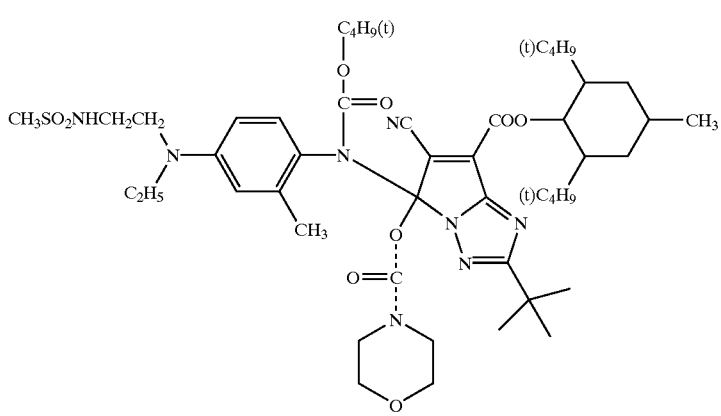

In the present invention, by combining the thermal polymerization initiator, the polymerizable monomer having a nucleophilic group, the acid-generating polymerizable monomer and the substance capable of forming a color when rendered to be present together with an acid, a heat-sensitive material may also be prepared. The thermal polymerization initiator can be preferably added in an amount of 0.01 to 10 mol %, more preferably from 0.05 to 5 mol %, and the substance capable of forming a color can be preferably added in an amount of 1 to 1,000 mol %, more preferably from 3 to 500 mol %, most preferably from 5 to 200 mol %, each based on the total amount of the monomers.

In the present invention, when a heat-sensitive material is prepared and an image is recorded thereon, the recording temperature is preferably from 80 to 350° C., more preferably from 100 to 300° C., most preferably from 150 to 250° C. The heating time varies depending on the heat source or use purpose, however, it is preferably from 1 micro-second to 60 seconds, more preferably from 1 micro-second to 10 seconds, and in the case of using the heat-sensitive material as an ordinary recording material, most preferably from 1 micro-second to 100 milli-seconds.

In the present invention, by combining the above-described materials, namely, the photopolymerization initiator, the polymerizable monomer having a nucleophilic group, the acid-generating polymerizable monomer and the substance capable of forming a color when rendered to be present together with an acid, a photosensitive material may be prepared. These materials may be arbitrarily combined. The photopolymerization initiator can be preferably added in an amount of 0.005 to 10 mol %, more preferably from 0.01 to 5 mol %, and the substance capable of forming a color can be preferably added in an amount of 1 to 1,000 mol %, more preferably from 3 to 500 mol %, most preferably from 5 to 200 mol %, each based on the total amount of the monomers.

In the present invention, when a photosensitive material is prepared and heated after the exposure, the acid generating rate and the dye forming rate may be accelerated. The heating temperature is preferably from 40 to 200° C., more preferably from 70 to 180° C., most preferably from 80 to 160° C. At this time, the heating may be performed using heating means such as hot plate, heat roller, infrared irradiation or heating drum.

The heating time is preferably from 0.1 to 100 seconds, more preferably from 0.5 to 30 seconds, most preferably from 1 to 20 seconds.

In the present invention, a polymerization inhibitor may be added for the purpose of stabilizing the composition of the present invention or for controlling the amount of an acid generated. The polymerization inhibitor used can be appropriately selected from known polymerization inhibitors such as phenols, nitro compounds and quinones.

In preparing a photosensitive material or a heat-sensitive material according to the present invention, all materials may be coated altogether on a support. Also, an oil-soluble binder such as polystyrene, polyvinyl alcohol, polyvinyl butyral and polymethyl methacrylate, may be used. Furthermore, these materials may also be used after forming it into oil droplets scattered in a hydrophilic binder. In this case, examples of the hydrophilic binder include gelatin, polyvinyl alcohol, modified polyvinyl alcohol, cellulose derivative and polyacrylamide.

It may also be possible to use necessary materials by housing them in a microcapsule.

The present invention is described in greater detail below by referring to the Examples, however, needless to say, the present invention should not be construed as being limited thereto.

EXAMPLE 1

For the purpose of verifying the principle of the present invention, a test was performed as follows.

0.15 g of Compound (A), 0.17 g of Compound N-02 and 0.03 g of Irgacure 651 (a photopolymerization initiator produced by Ciba Geigy) were dissolved in 0.5 g of cyclohexanone to form an oil phase. Separately, 1 g of a 16% aqueous solution of PVA205 (produced by Kuraray Co., Ltd.) and 0.1 g of a 5% aqueous solution of sodium dodecylbenzenesulfonate were mixed to form an aqueous phase. This aqueous phase was added to the oil phase prepared above and emulsification-dispersed by a micronizer. The resulting emulsified solution was coated on a polyethylene terephthalate film undercoated with gelatin to have a coated amount of 17.5 ml/m² and dried to prepare a photosensitive sheet.

Separately, 2.5 g of AEA and 7.5 g of methyl ethyl ketone were mixed and coated on a polyethylene terephthalate film to have a coated amount of 21 ml/m² and dried to prepare an image-receiving sheet.

The thus-prepared photosensitive sheet and image-receiving sheet were superimposed such that respective coated surfaces came into contact, exposed imagewise to a mercury lamp from the back side of the photosensitive sheet and then heated at 150° C. for 20 seconds. As a result, a yellow color image was obtained on the image-receiving sheet. This colored material was extracted with methylene chloride and analyzed, then, the material was found to be p-nitrophenol.

This result reveals occurrence of the reaction considered to be the principle of the present invention. To speak more specifically, from the fact that in the unexposed area free of occurrence of polymerization, a yellow image was not observed and only in the exposed area, a yellow image (image of p-nitrophenol) was obtained, it is considered that as a result of polymerization, the nucleophilic group derived from the nucleophilic monomer reacted with the electrophilic center derived from the acid-generating monomer (Compound 8A) and p-nitrophenol used as a monitor of acid was produced.

Furthermore, when the exposed and heated photosensitive sheet was observed by an infrared absorption spectrum, absorption was newly generated in the vicinity of from 1,740 to 1,750 cm$^{-1}$ (production of lactone) and this fact also supports the above-described presumption.

Compound (A):

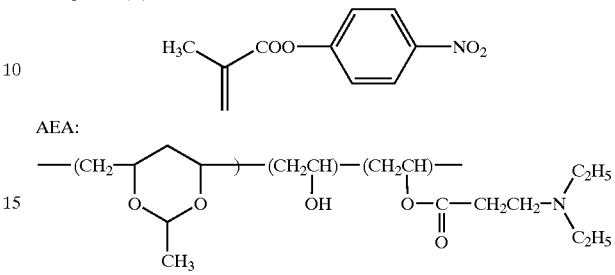

EXAMPLE 2

0.15 g of Compound N-06, 0.137 g of Compound A-09, 0.005 g of Compound (B) as a cationic dye, 0.01 g of Compound (C) as a borate compound, 0.01 g of Compound (D) as an internal standard, and 0.3 g of ethyl acetate were mixed and dissolved to form an oil phase. Separately, 0.86 g of a 16% aqueous solution of PVA205, 0.08 g of a 5% aqueous solution of sodium dodecylbenzenesulfonate and 0.72 g of water were mixed to form an aqueous phase. This aqueous phase was added to the oil phase prepared above and then emulsification-dispersed by a micronizer. To the resulting emulsified solution, the same amount of water was added and the solution obtained was coated on polyethylene terephthalate undercoated with gelatin, to have a coated amount of 35 ml/m² and dried to obtain a sample for analysis.

This sample was exposed at 100,000 lux for 10 seconds using a halogen lamp and thereafter heated at 110° C. for 10 seconds and then at 150° C. for 10 seconds from the back surface where the coated surface was covered with the polyethylene terephthalate film. Separately, an unexposed sample was prepared and heated in the same manner. These samples were analyzed using high performance liquid chromatography. The results obtained are shown in Table 1. The acid referred to in this Example is 2-octyloxy-5-(1,1,3,3-tetramethylbutyl)benzenesulfonic acid generated from A-09.

Compound (B)

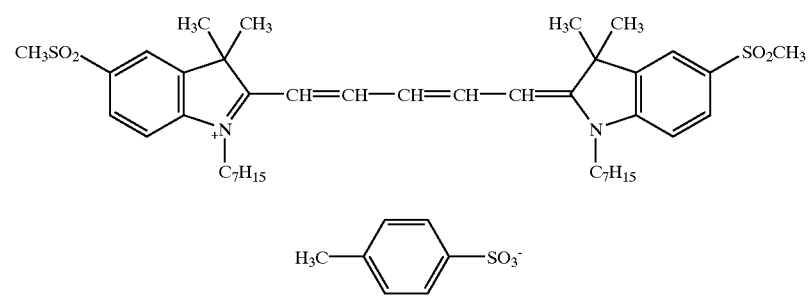

-continued

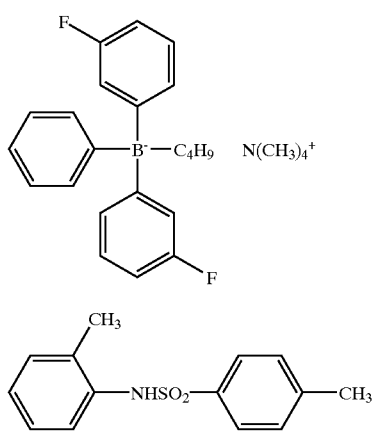

TABLE 1

Quantitation Results of Each Residual Amount of Nucleophilic Monomer and Acid-Generating Monomer, and Amount of Acid Generated

| Sample | Residual Amount of N-06 (%) | Residual Amount of A-09 (%) | Amount of Acid Generated (%) |
|---|---|---|---|
| Non-treated | 98 | 102 | 0.5 |
| Exposed for 10 sec, no heating | 25 | 71 | 7 |
| Exposed for 40 sec, no heating | 28 | 70 | 8 |
| Exposed for 10 sec, heated at 130° C. for 20 sec | 25 | 55 | 30 |
| Exposed for 10 sec, heated at 150° C. for 20 sec | 18 | 50 | 39 |
| Non-exposed, heated at 150° C. for 20 sec | 89 | 95 | 3 |

It is understood from Table 1 that about 40% of the acid-generating monomer is polymerized by the exposure and an acid is generated quantatively by the heating. Also, it is seen that in the case of an unexposed sample which is in the state of not being polymerized, even if it is heated, an acid is not generated. This result reveals that as intended in the present invention, an acid is generated by polymerization.

EXAMPLE 3

0.013 g of Leuco Dye (E), 0.05 g of Compound N-06, 0.1 g of Compound A-11, 0.0033 g of Compound (B), 0.0067 g of Compound (F), 1.73 g of a 10% methyl ethyl ketone solution of polystyrene, and 0.1 g of methyl ethyl ketone were mixed and dissolved. The resulting solution was coated on a polyethylene terephthalate film to have a coated amount of 35 ml/m² and dried. Further thereon, a solution obtained by mixing 10 g of a 16% aqueous solution of PVA205 and 1 g of a 5% aqueous solution of Compound (G) as a surface active agent was coated to have a coated amount of 21 ml/m² and dried. The sample obtained was imagewise exposed at 100,000 lux for 10 seconds using a halogen lamp and heated at 120° C. for 10 seconds from the back surface. As a result, a negative magenta color image was obtained. This reveals that an acid is generated by polymerization and thereby a color image is obtained.

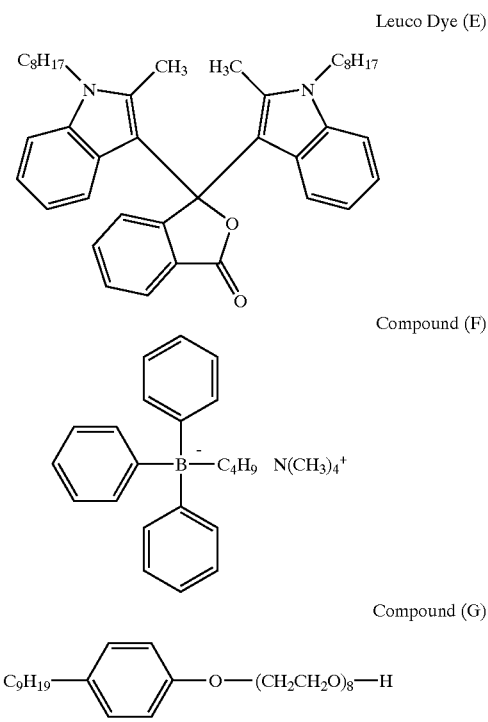

By using the acid-generating composition of the present invention and by applying light or heat thereto, a large amount of an acid can be effectively generated. Furthermore, by using a substance capable of forming a color when rendered to be present together with an. acid, a color image having good image quality can be effectively obtained.

EXAMPLE 4

0.03 g of BLD-11, 0.12 g of Compound N-05, 0.11 g of Compound A-11 and 1.73 g of a 10% methyl ethyl ketone solution of polystyrene were mixed to form a uniform solution. This solution was coated on a polyethylene terephthalate film undercoated with gelatin, to have a coated amount of 35 ml/m² and dried.

Further thereon, a solution obtained by mixing 10 g of a 16% aqueous solution of PVA205 (produced by Kuraray Co., Ltd.) and 1 g of a 5% aqueous solution of Compound (G) was coated to have a coated amount of 21 ml/m² and dried. This sample was designated as Sample 1.

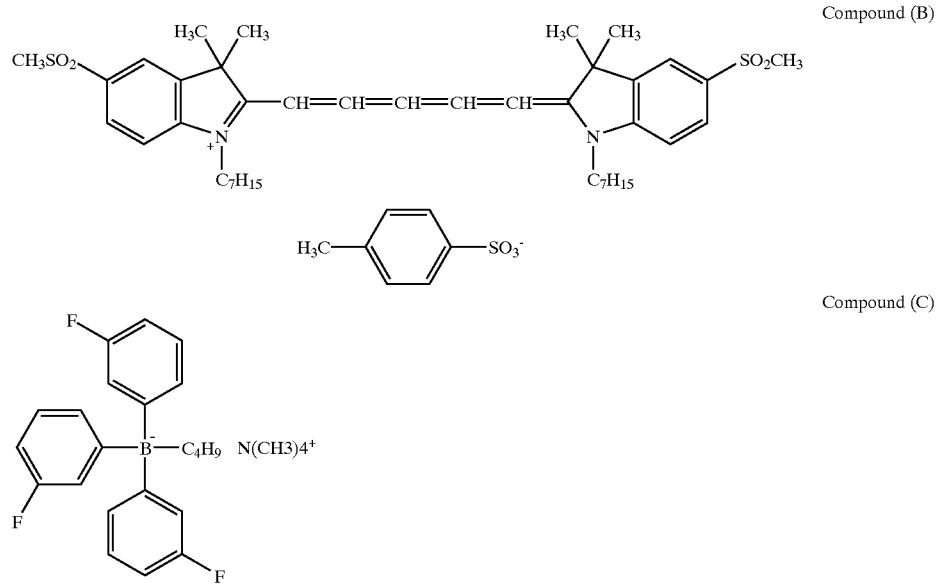

Sample 2 was prepared thoroughly in the same manner as Sample 1 except that 0.0005 g of 2,2'-azobisisobutyronitrile as a thermal polymerization initiator was added to the polystyrene solution.

Respective half portions of the back surfaces of Samples 1 and 2 were contacted with a heat block heated at 130° C. for 30 seconds. As a result, a magenta color was formed only in the area contacted with the heat block of Sample 2.

This color formation is considered to occur as a result of generation of an acid in the area where the monomer having a nucleophilic group and the acid-generating monomer are polymerized.

Compound (G)

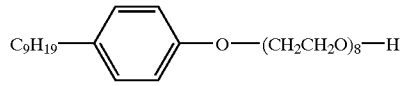

EXAMPLE 5

0.021 g of BLD-13, 0.1 g of Compound N-06, 0.09 g of Compound A-09, 0.0033 g of Compound (B) as a photopolymerization initiator, 0.0067 g of Compound (C) and 1.73 g of a 10% methyl ethyl ketone solution of polystyrene were mixed to form a uniform solution. This solution was coated on a polyethylene terephthalate film undercoated with gelatin, to have a coated amount of 35 ml/m² and dried.

Further thereon, a solution obtained by mixing 10 g of a 16% aqueous solution of PVA205 (produced by Kuraray Co., Ltd.) and 1 g of a 5% aqueous solution of Compound (G) was coated to have a coated amount of 21 ml/m² and dried.

This sample was exposed through a wedge having a transmission density of from 0 to 4 using a halogen lamp under the conditions of 100,000 lux and 40 seconds and then heated at 150° C. for 20 seconds from the back surface. As a result, a negative image where a magenta color was formed in the exposed area was obtained.

EXAMPLE 6

0.033 g of BLD-18, 0.15 g of Compound N-06, 0.137 g of Compound A-09, 0.005 g of Compound (B), 0.01 g of Compound (C) and 0.3 g of ethyl acetate were mixed and dissolved to form an oil phase.

Separately, 0.86 g of a 14% aqueous gelatin solution, 0.08 g of a 5% aqueous solution of sodium dodecylbenzenesulfonate and 0.72 g of water were mixed to form an aqueous phase. The oil phase was added to the aqueous phase and emulsification-dispersed using a micronizer. To this emulsified solution, the same amount of water was added and mixed, and the mixed solution obtained was coated on a polyethylene terephthalate film undercoated with gelatin, to have a coated amount of 35 ml/m² and dried. Further thereon, a solution the same as the aqueous phase prepared above was coated to have a coated amount of 21 ml/m² and dried.

This sample was exposed through a wedge having a transmission density of from 0 to 4 using a halogen lamp under the conditions of 100,000 lux and 40 seconds and thereafter heated at 150° C. for 20 seconds from the back surface. As a result, a negative image in which a cyan color is formed in the exposed area was obtained.

According to the present invention, a color image can be obtained through a simple dry process (exposure and/or heating). In particular, according to the present invention, a negative photosensitive material having a high sensitivity can be obtained.

While the invention has been described in detail and with reference to specific embodiments thereof, it will be apparent to one skilled in the art that various changes and modifications can be made therein without departing from the spirit and scope thereof.

What is claimed is:

1. An acid-generating composition comprising at least one polymerizable monomer having a nucleophilic group and at least one acid-generating polymerizable monomer, wherein the acid generating polymerizable monomer is represented by the following formula (2):

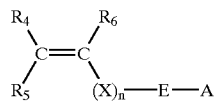

wherein X represents a divalent linking group, E represents a group having a nucleophilic access target (electrophilic) site; A represents a group capable of generating an acid as a result of the polymerizable monomer having a nucleophilic group copolymerizing with the acid-generating polymerizable monomer represented by formula (2) and the nucleophilic group derived from the polymerizable monomer having a nucleophilic group reacting with E in formula (2); n represents 0 or 1; and $R_4$, $R_5$ and $R_6$ each represents a hydrogen atom or a substituent, and $R_4$ and $R_5$, $R_4$ and $R_6$, $R_5$ and —$(X)_n$—E—A, or $R_6$ and —$(X)_n$—E—A may be combined with each other to form a ring.

2. The acid-generating composition as claimed in claim 1, which further contains a photopolymerization initiator.

3. The acid-generating composition as claimed in claim 1, wherein the polymerizable monomer having a nucleophilic group is represented by the following formula

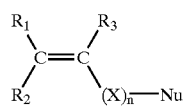

wherein X represents a divalent linking group, Nu represents a group having a nucleophilic site, n represents 0 or 1, $R_1$, $R_2$ and $R_3$ each represents a hydrogen atom or a substituent, and $R_1$ and $R_2$, $R_1$ and $R_3$, $R_2$ and —$(X)_n$—Nu, or $R_3$ and —$(X)_n$—Nu may be combined with each other to form a ring.

4. A color-forming composition comprising at least one polymerizable monomer having a nucleophilic group, at least one acid-generating polymerizable monomer and a substance capable of forming a color in the presence of an acid, wherein the acid-generating polymerizable monomer is represented by the following formula (2)

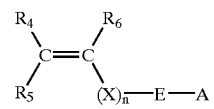

wherein X represents a divalent linking group, E represents a group having a nucleophilic access target site; A represents a group capable of generating an acid as a result of the polymerizable monomer having a nucleophilic group copolymerizing with the acid-generating polymerizable monomer represented by formula (2) and the nucleophilic group derived from the polymerizable monomer having a nucleophilic group reacting with E in formula (2); n represents 0 or 1; and $R_4$, $R_5$ and $R_6$ each represents a hydrogen atom or a substituent, and $R_4$ and $R_5$, $R_4$ and $R_6$, $R_5$ and —$(X)_n$—E—A, or $R_6$ and —$(X)_n$—E—A may be combined with each other to form a ring.

5. The color-forming composition as claimed in claim 4, wherein the polymerizable monomer having a nucleophilic group is represented by the following formula (1):

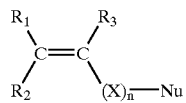

wherein X represents a divalent linking group, Nu represents a group having a nucleophilic site, n represents 0 or 1, $R_1$, $R_2$ and $R_3$ each represents a hydrogen atom or a substituent, and $R_1$ and $R_2$, $R_1$ and $R_3$, $R_2$ and —$(X)_n$—Nu, or $R_3$ and —$(X)_n$—Nu may be combined with each other to form a ring.

6. A photosensitive color-forming composition comprising at least one polymerizable monomer having a nucleophilic group, at least one acid-generating polymerizable monomer, a substance capable of forming a color in the presence of an acid, and a photopolymerization initiator.

7. The color-forming composition as claimed in claim 6, wherein the polymerizable monomer having a nucleophilic group is represented by the following formula (1):

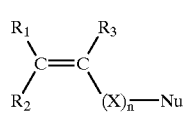

wherein X represents a divalent linking group, Nu represents a group having a nucleophilic site, n represents 0 or 1, $R_1$, $R_2$ and $R_3$ each represents a hydrogen atom or a substituent, and $R_1$ and $R_2$, $R_1$ and $R_3$, $R_2$ and —(X)—Nu, or $R_3$ and —$(X)_n$—Nu may be combined with each other to form a ring.

8. The color-forming composition as claimed in claim 6, wherein the acid-generating polymerizable monomer is represented by the following formula (2):

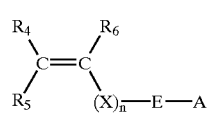

wherein X represents a divalent linking group, E represents a group having a nucleophilic access target site; A represents a group capable of generating an acid as a result of the polymerizable monomer having a nucleophilic group copolymerizing with the acid-generating polymerizable monomer represented by formula (2) and the nucleophilic group derived from the polymerizable monomer having a nucleophilic group reacting with E in formula (2); n represents 0 or 1; and $R_4$, $R_5$ and $R_6$ each represents a hydrogen atom or a substituent, and $R_4$ and $R_5$ $R_4$ and $R_6$, $R_5$ and —$(X)_n$—E—A, or $R_6$ and —$(X)_n$—E—A may be combined with each other to form a ring.

9. A recording material comprising a support having thereon at least one polymerizable monomer having a nucleophilic group, at least one acid-generating polymerizable monomer represented by formula (2), and a substance capable of forming a color in the presence of an acid wherein formula (2)

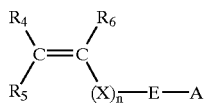
(2)

wherein X represents a divalent linking group, E represents a group having a nucleophilic access target site; A represents a group capable of generating an acid as a result of the polymerizable monomer having a nucleophilic group copolymerizing with the acid-generating polymerizable monomer represented by formula (2) and the nucleophilic group derived from the polymerizable monomer having a nucleophilic group reacting with E in formula (2); n represents 0 or 1; and $R_4$, $R_5$ and $R_6$ each represents a hydrogen atom or a substituent, and $R_4$ and $R_5$, $R_4$ and $R_6$, $R_5$ and $-(X)_n-$E$-$A, or $R_6$ and $-(X)_n-$E$-$A may be combined with each other to form a ring.

10. The recording material as claimed in claim 9, wherein the substance capable of forming a color in the presence of an acid is represented by the following formula (6):

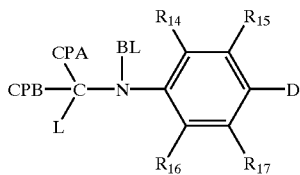
(6)

wherein D represents a hydroxyl group or $-NR_{18}BR_{19}$; $R_{14}$, $R_{15}$, $R_{16}$, $R_{17}$, $R_{18}$ and $R_{19}$ each represents a hydrogen atom or a substituent, and $R_{14}$ and $R_{15}$, $R_{15}$ and $R_{18}$ or $R_{19}$, $R_{17}$ and $R_{18}$ or $R_{19}$, or $R_{16}$ and $R_{17}$ may form a ring; BL represents a block group bonded to the nitrogen atom and the block group represents $-CONR_{20}R_{201}$ or another acid-sensitive removable group, L represents a splitting-off group; and CPA and CPB each represents an atomic group necessary for forming a color coupler together with the carbon atom (C in formula (6)) to which CPA and CPB are bonded.

11. A recording material comprising a support having thereon at least one polymerizable monomer having a nucleophilic group, at least one acid-generating polymerizable monomer, a substance capable of forming a color in the presence of an acid, and a photopolymerization initiator.

12. The recording material as claimed in claim 11, wherein the substance capable of forming a color in the presence of an acid is represented by the following formula (6):

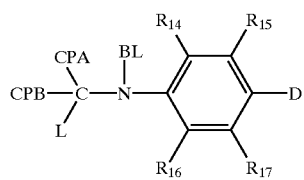

wherein D represents a hydroxyl group or $-NR_{18}R_{19}$; $R_{14}$, $R_{15}$, $R_{16}$, $R_{17}$, $R_{18}$ and $R_{19}$ each represents a hydrogen atom or a substituent, and $R_{14}$ and $R_{15}$, $R_{15}$ and $R_{18}$ or $R_{19}$, $R_{17}$ and $R_{18}$ or $R_{19}$, or $R_{16}$ and $R_{17}$ may form a ring; BL represents a block group bonded to the nitrogen atom and the block group represents $-CONR_{20}R_{201}$ or another acid-sensitive removable group, L represents a splitting-off group; and CPA and CPB each represents an atomic group necessary for forming a color coupler together with the carbon atom (C in formula (6)) to which CPA and CPB are bonded.

* * * * *